US005627489A

United States Patent [19]
Jochum

[11] Patent Number: 5,627,489
[45] Date of Patent: May 6, 1997

[54] LEVEL SHIFTER WITH IMPROVED REJECTION OF VOLTAGE VARIATIONS

[75] Inventor: Thomas A. Jochum, Durham, N.C.

[73] Assignee: Harris Corp., Melbourne, Fla.

[21] Appl. No.: 493,824

[22] Filed: Jun. 22, 1995

[51] Int. Cl.$^6$ .................................................. H03L 5/00
[52] U.S. Cl. ........................... 327/333; 326/21; 326/62; 323/315
[58] Field of Search ........................ 327/333, 306, 327/538–543; 326/21, 62; 330/288; 323/315–317

[56] References Cited

U.S. PATENT DOCUMENTS

| | | | |
|---|---|---|---|
| 4,767,946 | 8/1988 | Taylor | 327/333 |
| 4,792,704 | 12/1988 | Lobb et al. | 327/333 |
| 5,459,427 | 10/1995 | Chambers et al. | 327/333 |

Primary Examiner—Timothy P. Callahan
Assistant Examiner—Kenneth B. Wells
Attorney, Agent, or Firm—Rogers & Killeen

[57] ABSTRACT

A level shifter for shifting a digital signal input voltage to a digital signal output voltage and for rejecting voltage variations in the level shifter that would cause the level shifter to shift in error. The level shifter includes a trigger for triggering a pulse at each transition of the digital signal between an input supply voltage and an input reference voltage, a latch for switching the digital signal to one of an output supply voltage and an output reference voltage in response to each pulse from the driver and holding the digital signal at that voltage, and two half-shifters connected between the trigger and the latch for providing the pulse to said latch when the digital signal transitions. Each of the half-shifters include a selector circuit with series-connected current mirrors connected to a current source for providing a current to the current mirrors responsive to receipt of the pulse. The current mirrors include components for reducing capacitances in the selector circuit and discharging stored charges at transistor junctions that induce voltage variations that would cause the latch to switch other than in response to the pulse if the voltage variations were provided to the latch. The level shifter may include a circuit for correcting an incorrect latch position.

23 Claims, 12 Drawing Sheets

LEVEL SHIFTER WITH IMPROVED REJECTION OF VOLTAGE VARIATIONS

BACKGROUND OF THE INVENTION

The present invention relates to level shifters, and more particularly to an improved level shifter that rejects voltage variations that would cause the level shifter to shift in error.

A level shifter shifts digital signal input voltages to digital signal output voltages. That is, it takes a digital signal that has one set of input voltages, typically input supply and reference voltages (e.g., 10 and zero volts) and shifts the input voltages to some other level appropriate for a specific application, typically output supply and reference voltages (e.g., 110 and 100 volts.) The level shifter also includes a trigger connected to the input supply and reference voltages for triggering a pulse at each transition of the digital signal between the input supply voltage and the input reference voltage, and a latch connected to the output supply and reference voltages for switching and holding the digital signal to one of the output supply voltage and the output reference voltage in response to receipt of a pulse from the trigger.

A level shifter typical of the prior art is illustrated in FIG. 1. The level shifter 10 has six connections: IN, OUT, VDD, VSS, HB, HS. VSS is the ground reference for the circuit. VDD is the supply voltage relative to VSS. HS is called the "floating" ground and HB is the supply voltage relative to HS. IN is a digital input whose logic zero voltage is the VSS voltage and whose logic one voltage is the VDD voltage. OUT is a digital output whose logic zero voltage is the HS voltage and whose logic one voltage is the HB voltage. The logical value of OUT is the same as that of IN. That is, when IN is high then OUT is high and when IN is low then OUT is low. As an example of typical operation, if VSS is 0 V then VDD is 10 V, HS is 100 V, and HB is 110 V. When IN is 0 V then OUT is 100 V and when IN is 10 V then OUT is 110 V.

In FIG. 1 there are four voltage sources. The sources labelled VHB and VDD are DC sources. The source labelled VIN is a digital signal generator, that is, its voltage is either VSS or VDD except when it is rapidly transitioning from one to the other. The last source, labelled VHS, may have any value, although typically it is limited to some range, such as between −1 V and 100 V. The HS voltage changes to any voltage from −1 V to 100 V without upsetting the relationship between IN and OUT. The HS voltage variation is desirably less than some value, such as less than 10 V per 1 ns. The invention disclosed herein improves the rejection of HS variations.

With further reference to FIG. 1, a prior art level shifter 10 may include trigger 12 and receiver 14, current source IIN, resistor Rload, and capacitor Cerror. Trigger 12 turns on current source IIN in response to input signal IN. The current from current source IIN flows into resistor Rload and creates a voltage drop across the resistor. This voltage drop is sensed by receiver 14 which drives the OUT signal to the correct value. This normal mode of operation can get disturbed when the HS voltage changes because the unavoidable parasitic capacitor Cerror also causes current to flow in resistor Rload. For example, if Cerror is 1 pF and HS increases at 10 V/ns then 10 mA flows in Rload. If receiver 14 cannot distinguish this 10 mA of error current from the intentional current produced by IIN then receiver 14 will drive the OUT pin to the incorrect value.

HS variations can cause improper operation in several ways, and the typical prior art level shifter may include components for reducing HS variations. With reference now to FIG. 2, the prior art level shifter may include paired circuits to attempt to reject the variations in HS voltage. Trigger 12, receiver 14, current source IIN, and resistor Rload may be copied (copies provided with a suffix "2" in FIG. 2) and driven with the inversion of the IN signal. When IN is high current source IIN is activated and when IN is low current source IIN2 is activated. Another circuit block, subtractor 16, is inserted between resistors Rload and receiver 14. Subtractor 16a subtracts the signal on Rload2 from the signal on Rload and passes the result to receiver 14a. If IN is high then there is a signal on Rload and no signal on Rload2. Since there is no signal on the subtracting input to subtractor 16a the signal on Rload is sent to receiver 14a which, in turn, forces OUT high. Likewise, if IN is low then resistor Rload2 has a signal and resistor Rload has none.

The HS variations can create current in the two capacitors, Cerror and Cerror2. These currents cause voltage drops on Rload and Rload2 that are added to the desired voltages on the resistors. If the two capacitors are equal sized and the two resistors are also equal then the HS variations add the same voltage to each resistor. Subtractor 16 subtracts these voltages from each other so no variation-induced signal is passed on to receiver 14 and the OUT signal is unchanged.

The circuit may include triggers 12 for decreasing power dissipation in the current sources by only turning on during the pulses that are generated by the edge-triggered one-shots. That is, IIN is pulsed on just after a rising edge on the IN node and IIN2 is pulsed on following a falling edge on IN. The current sources only dissipate power during the pulses and so the average power dissipation is decreased.

The level shifter may also include a second subtractor 16b and receiver 14b, a latch 18 for converting the pulses into a stable level on the OUT node, and diodes 20 for only transmitting positive pulses. The pulse of current from IIN (generated on the rising edge of IN) creates a positive pulse on the output of subtractor 16a and a negative pulse on the output of subtractor2 16b. The positive pulse passes through diode 20a while the negative pulse is blocked by diode 20b. Receiver 14a will then have a pulse on its output while receiver2 14b output will remain in the low state. The pulse from receiver 14a drives the SET input of latch 18. This causes OUT to go high and to stay high until a falling edge on IN creates a similar sequence of events as described above that conclude with a pulse on the RESET input to latch 18.

While the circuit of FIG. 2 may reduce power dissipation, the output is stored in a latch. If a disturbance, such as excessive HS variation, a glitch from the VHB supply, or radiation, causes the latch to flip states at the wrong time, the output of the level shifter will not be the same as the input. In many level shifter applications, such as power systems, an incorrect output can lead to the destruction of the electronics and maybe even the load (motor, transformer, solenoid, etc.).

Accordingly, it is an object of the present invention to provide a novel level shifter that obviates the problems of the prior art in rejecting voltage variations that cause the level shifter to shift in error.

It is another object of the present invention to provide a novel level shifter that includes plural current mirrors connected to reduce capacitances that would cause a latch in the level shifter to switch in error.

It is yet another object of the present invention to provide a novel level shifter that includes plural current mirrors connected to discharge stored charges in current mirror transistor junctions that would cause a latch in the level shifter to switch in error.

It is still another object of the present invention to provide a novel level shifter with a current source for providing a current to current mirrors responsive to receipt of a pulse, wherein the current source has a transistor with a source terminal that is an open circuit when the voltage on the source is less than an input supply voltage for reducing a capacitance that induces voltage variations.

It is a further object of the present invention to provide a novel level shifter with series connected current mirrors for providing two copies of a capacitance-induced error current that have a timing relationship that ensures that the latch can not be switched.

It is yet a further object of the present invention to provide a novel level shifter with a current mirror having a load transistor for sensing a voltage related to a pulse, and with a second diode for diverting current from a drain of the load transistor to thereby reduce a charge stored in a junction of the load transistor and reduce a time for discharging the stored charge when an output reference voltage changes from a falling voltage to a rising voltage.

It is still a further object of the present invention to provide a novel level shifter with current mirrors having load transistors for sensing a voltage related to a pulse, each with a parasitic transistor for selectively diverting current from a drain of its load transistor to thereby selectively reduce a charge stored in a junction of the load transistor so that a voltage variation caused by a difference between times for discharging the stored charge in the load transistors does not cause the latch to switch when the output reference voltage changes from a falling voltage to a rising voltage.

It is an additional object of the present invention to provide a novel level shifter with a logic circuit for comparing a state of the latch to a state of the digital signal input voltages, and for providing a corrective signal when the two states are different.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
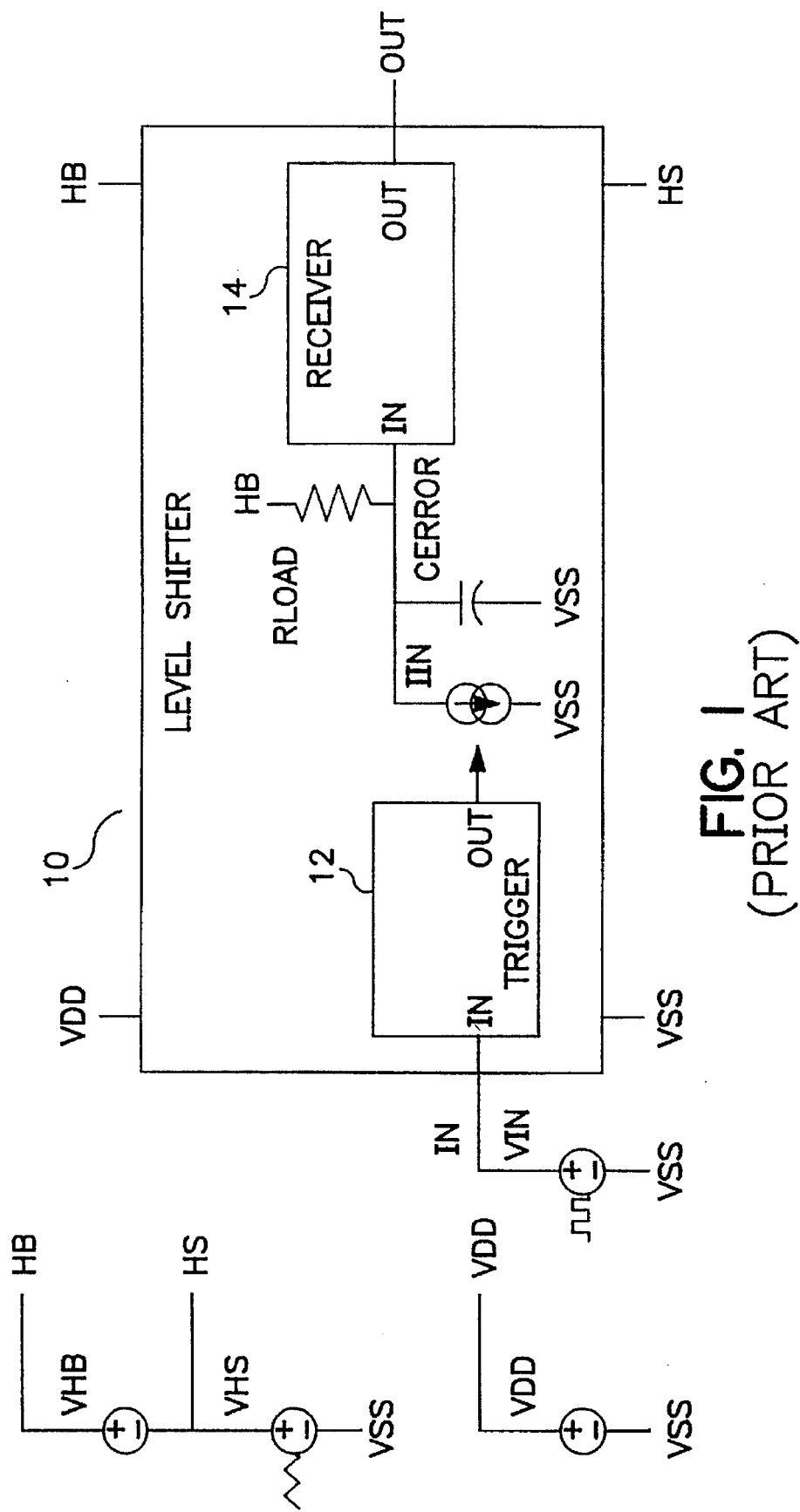
FIG. 1 is block diagram of a level shifter of the prior art.
Figure 2:
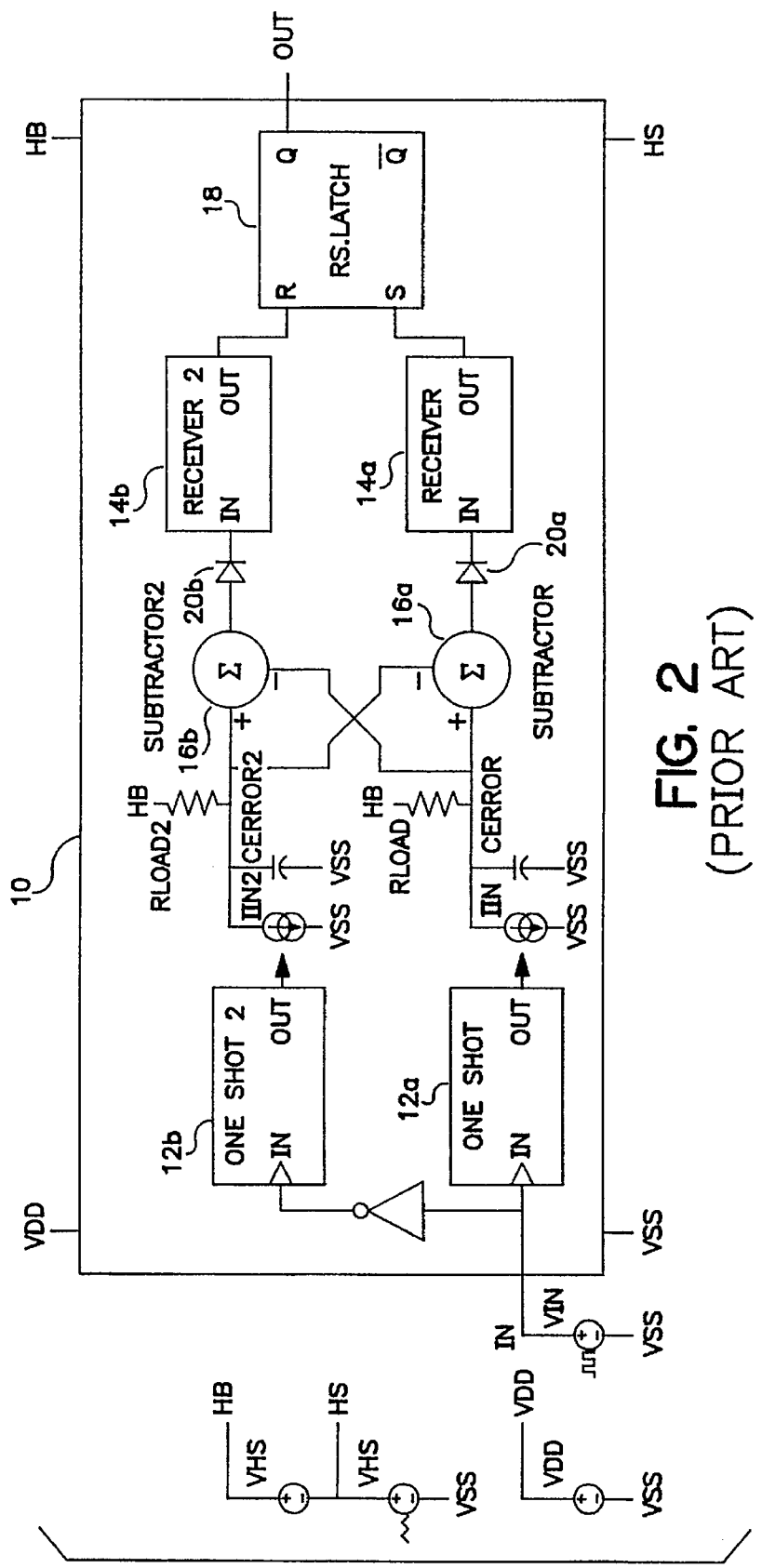
FIG. 2 is a combination block and circuit diagram of a level shifter of the prior art.
Figure 3:
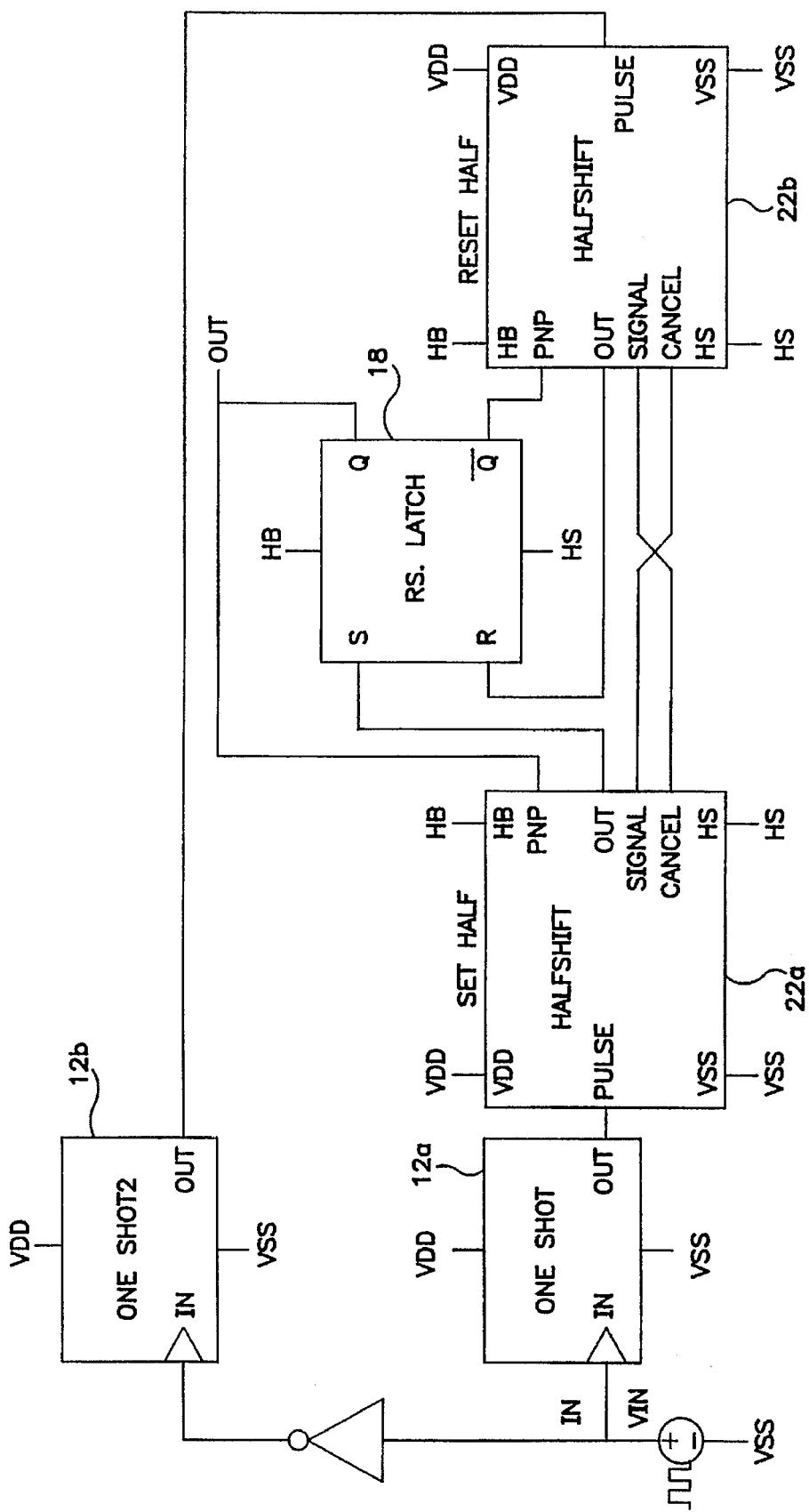
FIG. 3 is a combination block and circuit diagram of an embodiment of a level shifter of the present invention.

With reference now to FIG. 3, an embodiment of the present invention may include two circuits, referred to herein as half-shifters 22a and 22b, for improving the rejection of the voltage variations so that latch 18 is not inadvertently reset. Each half-shifter 22 includes components that perform the functions of the current source, load resistor, subtractor, diode, and receiver from FIG. 2 Each half-shifter 22 also performs the further functions described below.

Operation Overview

Figure 4:
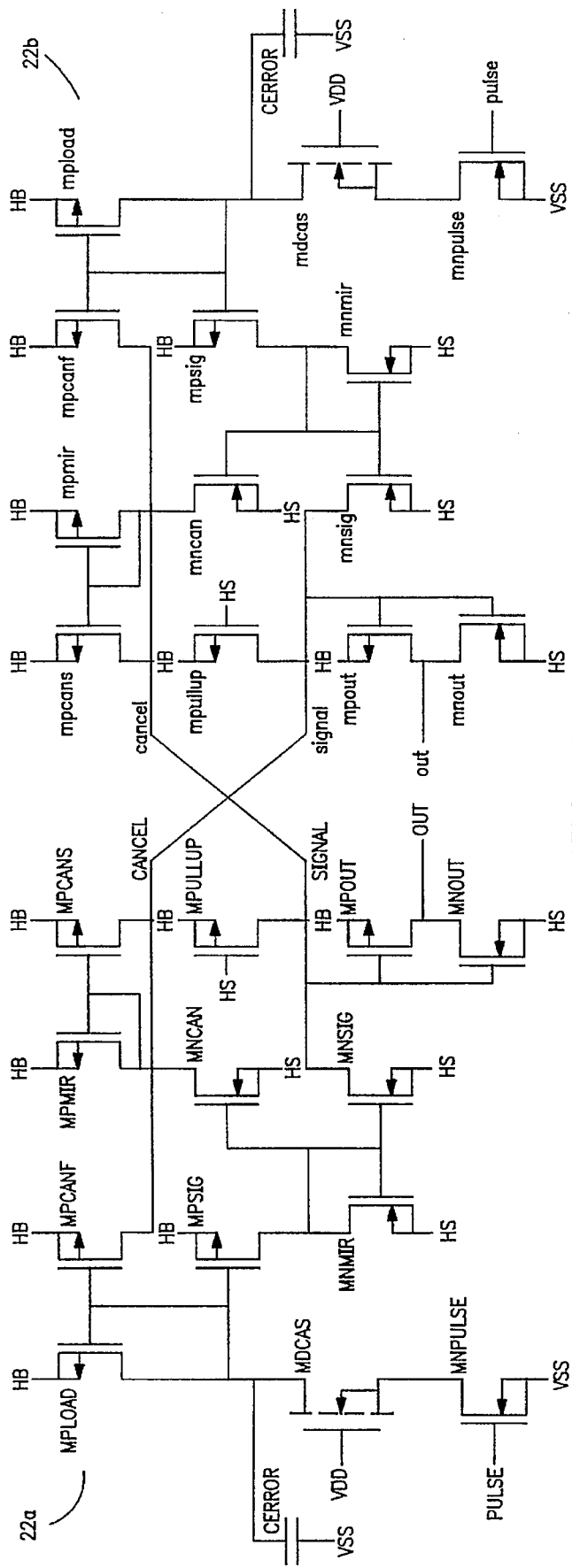
FIG. 4 is a circuit diagram of an embodiment of a pair of the half-shifters of FIG. 3.

The operation of half-shifters 22 may be more clearly understood by considering FIGS. 3 and 4. In FIG. 3 half-shifter 22a is labelled SET HALF and half-shifter 22b is RESET HALF. In FIG. 4, all the device and node names for the RESET HALF are designated with lower case letters so that they can be distinguished from the SET HALF's labels. The cross-connection of the CANCEL and SIGNAL pins that is shown in FIG. 3 is also shown in FIG. 4. This cross-connection is functionally equivalent to the cross-connection of subtractor 16 inputs in FIG. 2.

In FIG. 4, the current source IIN of FIG. 2 may be implemented by the two NMOS transistors MNPULSE and MDCAS. The load resistor in FIG. 2 may be a diode-connected PMOS transistor MPLOAD. The subtractor 16 in FIG. 2 may be built with transistors MPCANF, MPSIG, MNMIR, MPMIR, MNCAN, MNSIG, and MPCANS. The diode function in FIG. 2 may be realized by the PMOS device MPULLUP. The receiver of FIG. 2 may be the CMOS inverter made with transistors MPOUT and MNOUT. The parasitic capacitance CERROR is an unintended side-effect of building the transistor MDCAS.

In operation, if neither intentional pulses nor variations of HS voltage are occurring the half-shifters 22 are resting in their idle state. The only devices that are on are MPULLUP, MNOUT, mpullup, and mnout. MPULLUP and mpullup are always on because their gates are tied low. They pull-up the SIGNAL and signal nodes to a high value. Both outputs are low and so they have no effect on latch 18.

When the input signal to the level shifter transitions from low to high, trigger 12a drives the PULSE input of half-shifter 22a with a positive voltage pulse. The transistor MNPULSE is turned on because its gate is high and it conducts a current I. Current I flows through MDCAS and into MPLOAD. MPLOAD and MPSIG form a current mirror so MPSIG also conducts current I that flows into MNMIR. MNMIR and MNSIG also form a current mirror so MNSIG conducts current I. The amount of current the MPULLUP can provide Ip is selected to be less than current I so the net current on the node labelled SIGNAL is in the direction to pull SIGNAL to a low value. SIGNAL going low forces OUT to go high which, in turn, sets latch 18 and places the output of the entire level shifter in the correct state.

Transistor MPCANF is another output for the current mirror whose input transistor is MPLOAD. MNCAN is another output for the current mirror whose input transistor is MNMIR. Transistors MPMIR and MPCANS form a current mirror. All these current mirrors are conducting current I so there is a net current of 2I flowing out of the CANCEL pin of half-shifter 22a and into the signal pin of half-shifter 22b. This current would pull up the "signal" node of half-shifter 22b, but since this node is already pulled up by transistor mpullup the 2I current is essentially ignored. This is functionally equivalent to the diode in FIG. 2 eliminating the negative pulses from the subtractors.

When the voltage on the HS node varies, the outputs of the half-shifters 22 are supposed to stay low so that latch 18 doesn't change states. As explained earlier, the currents flowing through parasitic capacitors have to be rejected, regardless of whether the voltage on is HS rising or the voltage on is HS falling.

When the voltage on HS rises, the voltage on HB goes up equally because there is only a dc voltage difference between HB and HS. The transistors MPLOAD and mpload are relatively low impedance and so the voltage on their drains is also rising equal to the HS variation. Thus the voltage across capacitors CERROR and cerror is increasing and this produces error current Ie. Error current Ie would have the same effect as the current I (that is, forcing the outputs of the half-shifters 22 high) except for the cancellation achieved by using current mirrors. This cancellation is functionally equivalent to the subtractors shown in FIG. 2. As is apparent from FIG. 4, all the mirror transistors (MPCANF, MPSIG, MNMIR, MNSIG, MNCAN, MPMIR, MPCANS, mpcanf, mpsig, mnmir, mnsig, mncan, mpmir, and mpcans) are carrying the current Ie. The node labelled SIGNAL has a current of value Ie pulling down on it from transistor MNSIG. However, it has a current of 2Ie+Ip pulling up on it from transistors MPULLUP, mpcans, and mpcanf. The net current on the node is in the direction to keep the node voltage high. The node "signal" in half-shifter 22b is similarly held high. The HS variation has not caused any changes to the outputs of half-shifters 22 and so the latch is unaffected by the variation.

When HS voltage is falling an error current is produced by parasitic capacitors Cerror. However, the direction of the current is opposite of that when the voltage is rising as discussed above. The gates of transistors MPCANF, MPSIG, mpcanf, and mpsig are driven to a voltage that merely keeps them turned off. There is no current flowing in any of the current mirrors and so the pullup transistors keep the nodes "SIGNAL" and "signal" high.

Figure 5:
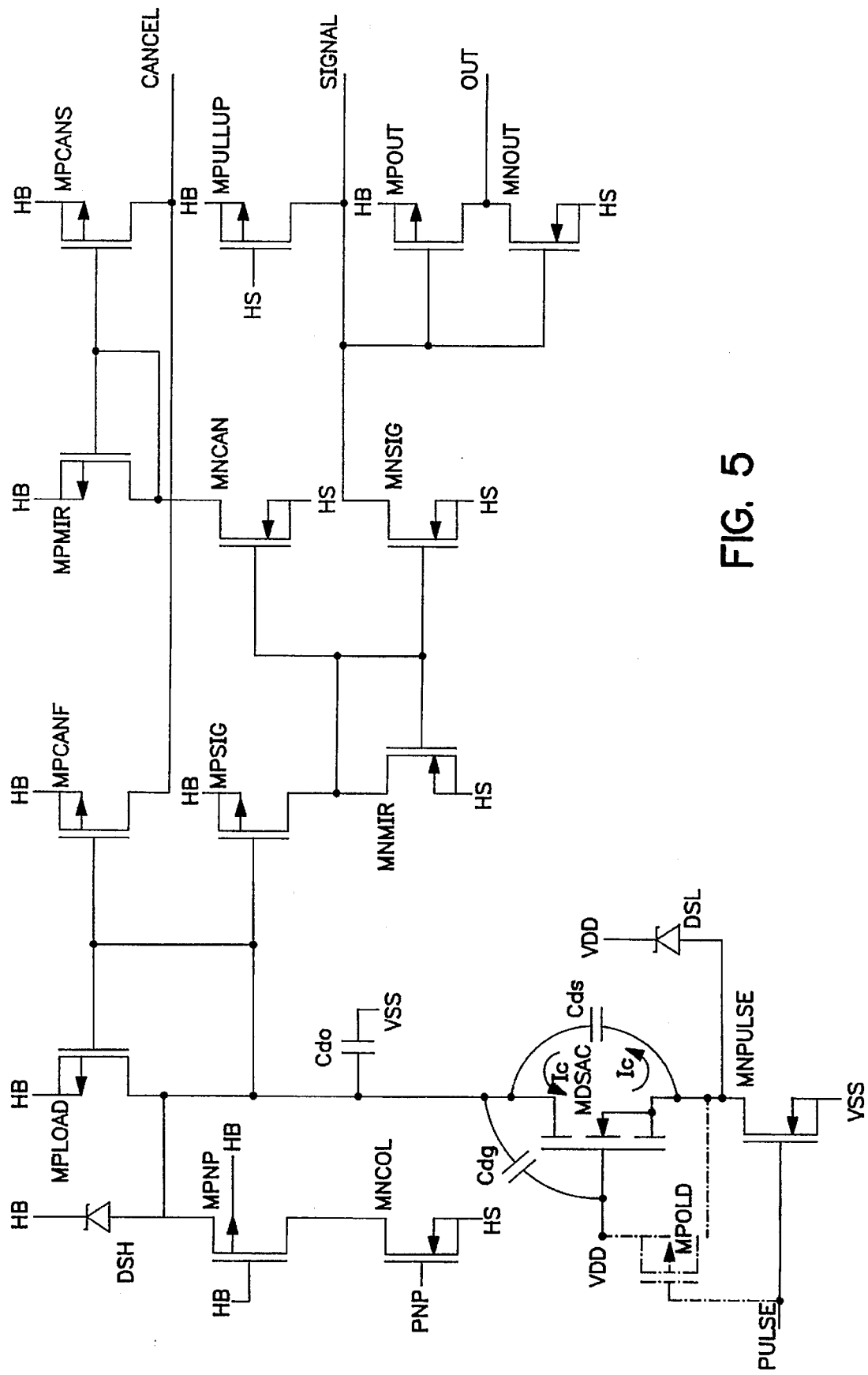
FIG. 5 is a circuit diagram of an embodiment of the half-shifter of the present invention.

The improvements of the present invention may be more easily understood with reference now to FIG. 5.

Reduction of Cerror

Parasitic capacitor CERROR in FIG. 4 is a simplified representation of the three parasitic capacitances shown in FIG. 5. Parasitic capacitance Cds is the drain-to-source capacitance of the NMOS transistor MDCAS. Parasitic capacitance Cdg is the drain-to-gate capacitance of MDCAS. Parasitic capacitance Cdo is the sum of the drain-to-substrate capacitance of MDCAS and any other capacitances from VSS to the entire net that connects to MDCAS's drain. The three capacitances are typically about the same magnitude, although this is not required.

Reducing the size of CERROR improves the rejection of variations of HS voltage because it reduces the error currents. The capacitance Cds can be figuratively eliminated during negative transitions of HS if the source of MDCAS is left open-circuited. In the prior art, the source of MDCAS was typically pinned to the VDD potential through the PMOS transistor MPOLD (shown in dashed lines). If MPOLD is replaced with the diode DSL then the source of MDCAS is open-circuited when its voltage is less than VDD.

The benefit of creating an open-circuit on the source of MDCAS is that any voltage variation on MDCAS's drain is capacitively coupled to MDCAS's source via Cds. As the voltage on HS decreases so does the voltage on the drain of MDCAS, as explained earlier. The drain voltage decrease is capacitively coupled to the source and turns-on MDCAS because its gate is at a fixed potential. As MDCAS's drain voltage continues to decrease, the removal of charge from Cds is accomplished by current Ic flowing in MDCAS instead of a current flowing through MPLOAD. Thus, the error current Ie is reduced which is equivalent to reducing the capacitor CERROR.

Elimination of a Glitch in the Subtractor

As discussed above, a current of 2Ie+Ip is pulling up on the signal nodes and a current of only Ie is pulling down when the HS voltage is rising. While it would appear that one of the transistors, MPCANF or MPCANS, could be eliminated and the circuit operation would not change because the pull-up current would still be greater than the pull-down current, this rationale would only be true during the middle of an error current pulse. For example, if MPCANS were eliminated, at the beginning or end of the error current pulse there would be a brief time when MPCANF was not pulling up but mnsig would still be pulling down. The "signal" node would momentarily drop in voltage which could cause "out" to glitch upwards and reset the latch when it should not be reset.

Figure 6:
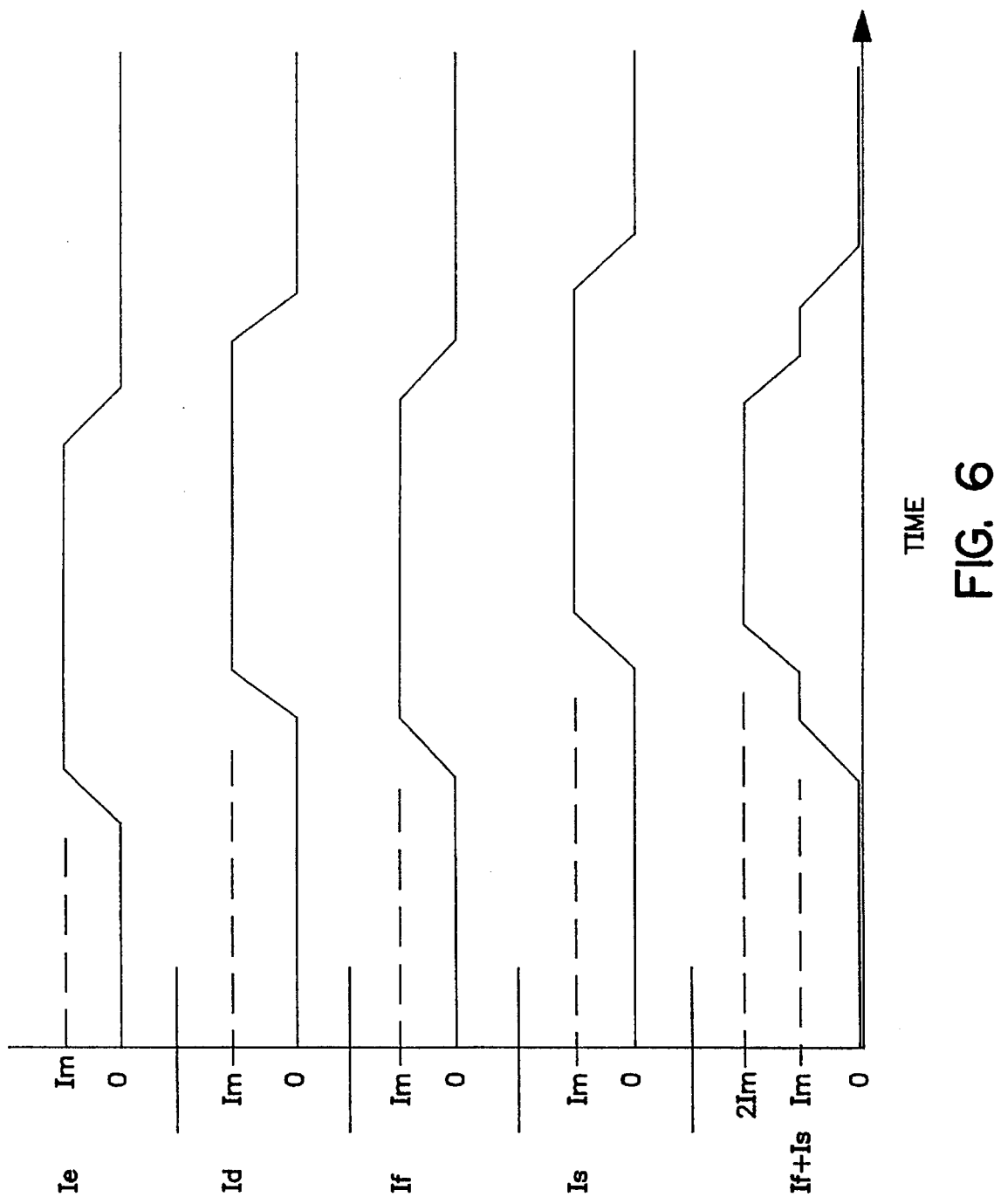
FIG. 6 is a timing diagram illustrating glitch suppression in the subtractor.
Figure 7:
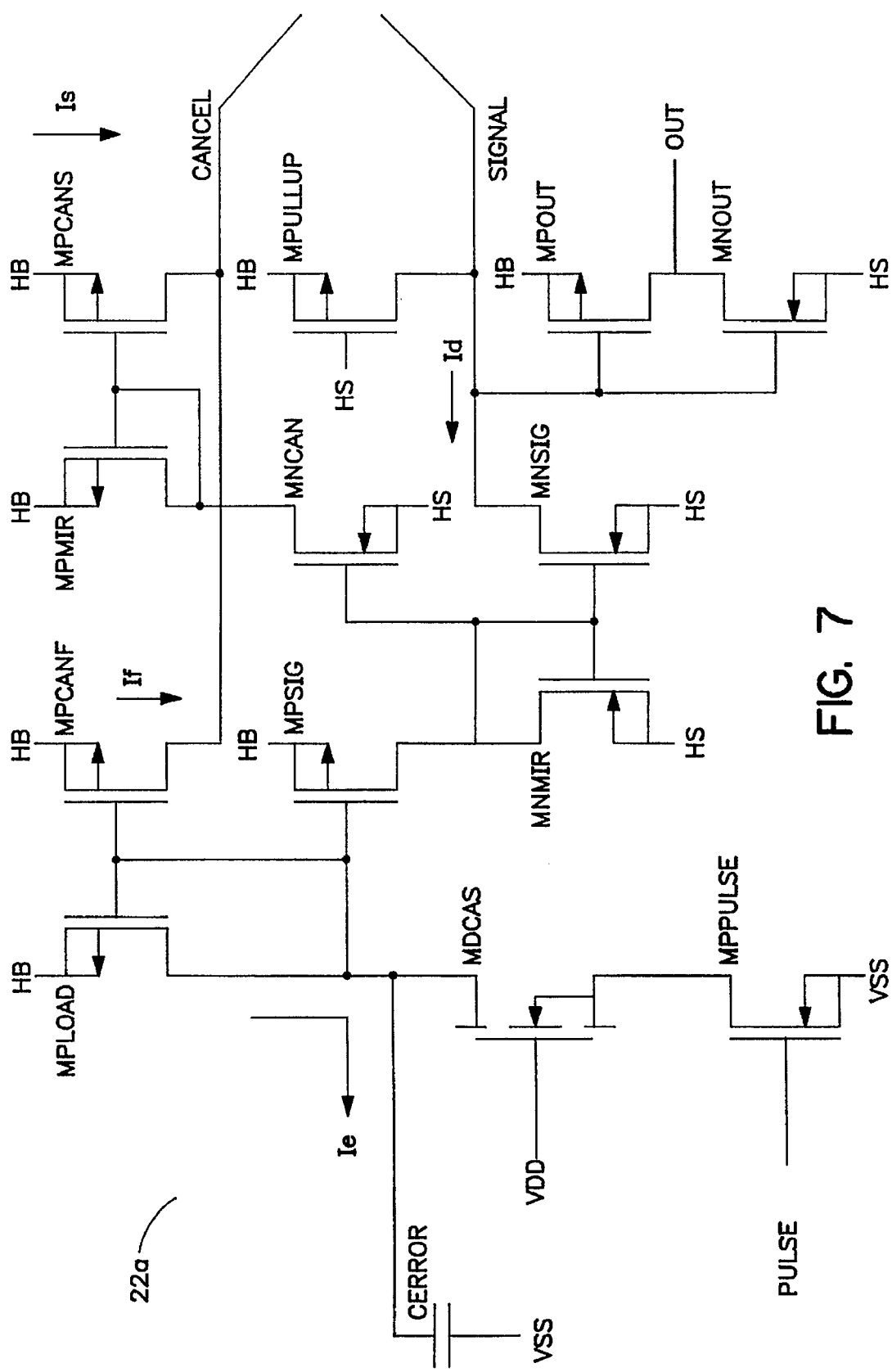
FIG. 7 is a circuit diagram of one of the half-shifters of FIG. 4 with current designations added to aid in understanding the timing diagram of FIG. 6.

The solution to this timing problem is to provide a fast and a slow pull-up path that bracket the delay of the pull-down path. FIG. 6 shows the timing relationships among the various currents and FIG. 7 shows half-shifter 22a from FIG. 4 with the currents shown (similar currents would be provided in the other half-shifter). A positive transition on HS causes a pulse of error current Ie to flow in transistors MPLOAD and mpload. The magnitude of the pulse is Im. A little while later this pulse causes a pull-down current Id to flow in the NMOS transistor MNSIG. This pull-down current would cause the "SIGNAL" node to glitch downwards except that a pull-up current If is already pulling up. At the end of the HS transition, the error current stops and shortly thereafter the pull-up current If stops. The pull-down current Id is still flowing and "SIGNAL" would glitch downwards except that a different pull-up current Is is still flowing. By combining a slow and fast path, the sum of the pull-up currents (If+Is in FIG. 6) is always equal to or greater than the pull-down current and so no glitch happens on the SIGNAL node.

The timing relationship among currents If, Id, and Is is established by connecting the current mirrors in series. Current If is the output of the first current mirror (MPCANF) so it appears before currents Id or Is. Current Id is the output of the second mirror (MPSIG, MNMIR, and MNSIG) and current Is is the output of the third mirror (MNCAN, MPMIR, and MPCANS).

Reducing Charge Storage in MPLOAD

As explained above, there is no danger of creating a false output from the level shifter as HS is decreasing in voltage. The error current Ie flows into the drain of transistor MPLOAD but it does not flow out the source because the transistor is off (its gate voltage is greater than its source voltage). Instead, the current flows out the n-well connection of the PMOS. However, the same is not true when the voltage is changing from a falling voltage to a rising voltage. As with all bipolar diodes, charge is stored near the junction during forward conduction. When HS changes from a falling voltage to a rising voltage the stored charge must be removed before the voltage on MPLOAD's drain can swing negative. The two load transistors MPLOAD and mpload and the two parasitic capacitors CERROR and cerror can not be perfectly matched because of process and temperature differences so the charge stored in MPLOAD's n-well will not be exactly equal to the charge stored in mpload's n-well.

Figure 8:
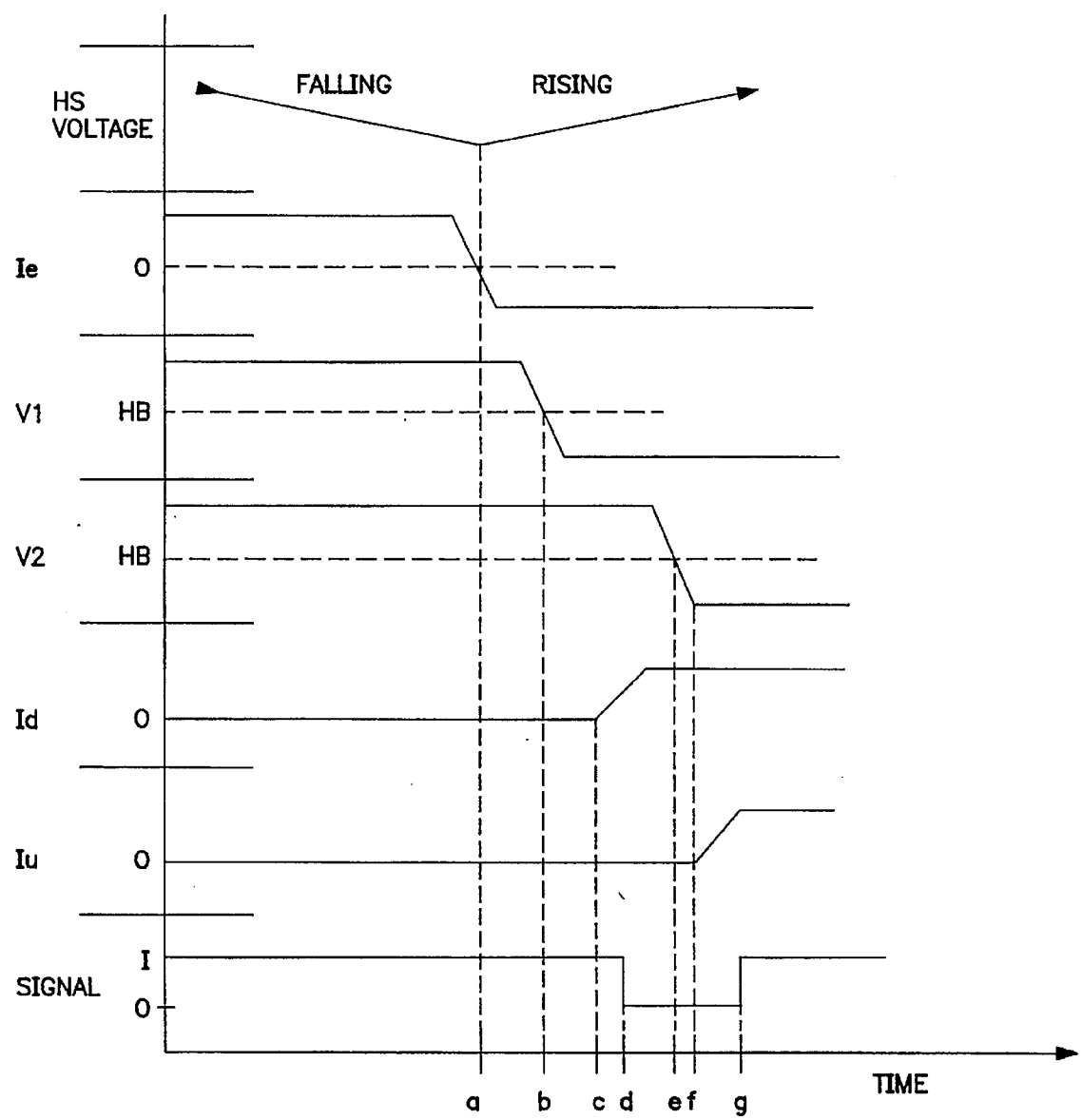
FIG. 8 is a timing diagram illustrating the timing of discharge of load transistors that causes the latch to reset in error.
Figure 9:
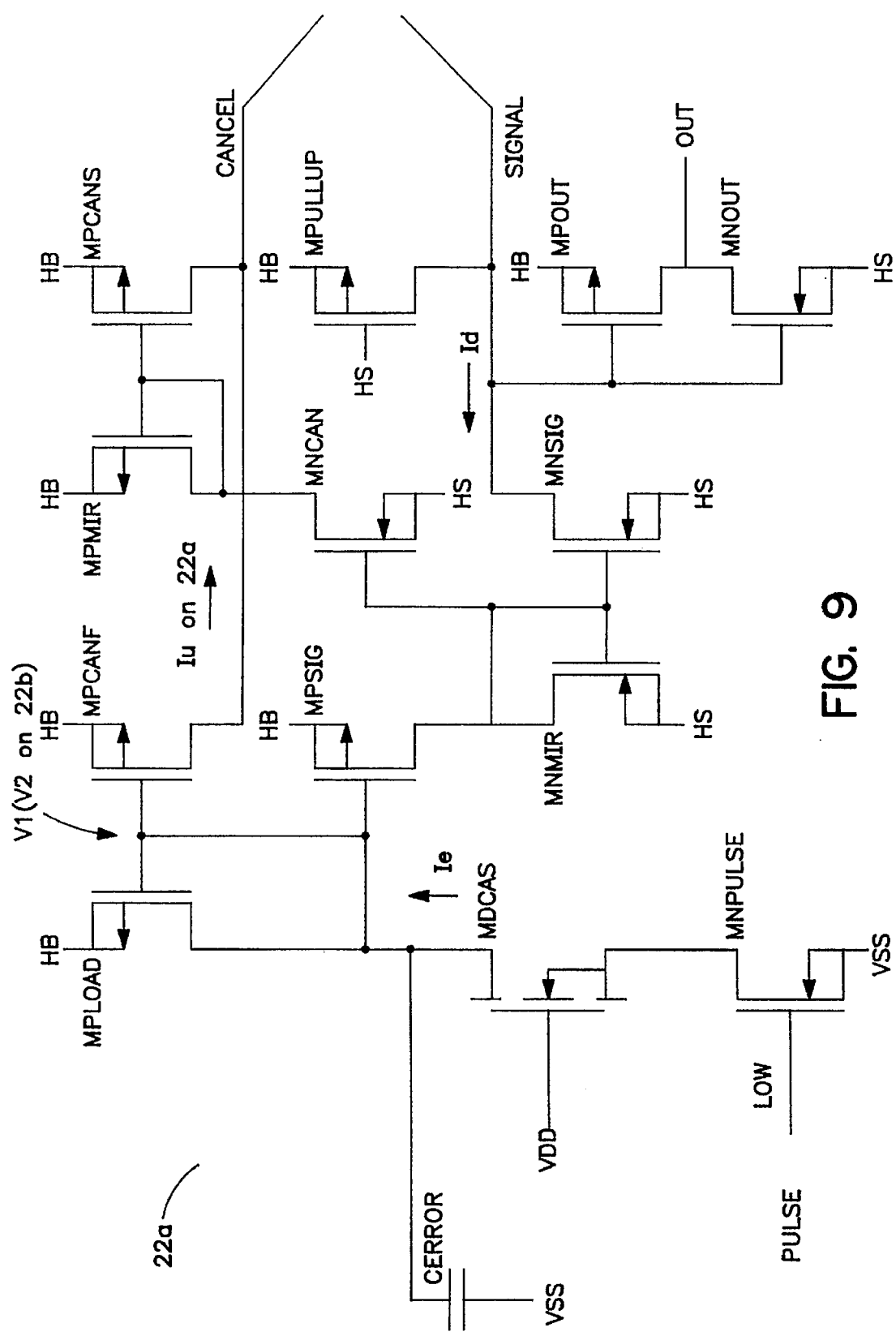
FIG. 9 is a circuit diagram of one of the half-shifters of FIG. 4 with current designations added to aid in understanding the timing diagram of FIG. 8.

For example, mpload's charge may be greater than MPLOAD's. This situation is shown in FIGS. 8 and 9. At time a, the voltage on HS changes from falling to rising and the error current Ie changes from positive to negative. The negative current removes charge from MPLOAD's and mpload's n-well diode and the transistors' drain voltages will not start to decrease until this charge is removed. At time b, all of MPLOAD's charge is removed and its drain voltage V1 decreases which turns on current Id at time c. The current Id pulls down the SIGNAL node at time d. At time e the diode on mpload finally loses its charge and the voltage on mpload's drain V2 decreases. The pull-up current Iu in half-shifter 22b turns on at time f and SIGNAL returns high at time g. The momentary downward pulse on SIGNAL will cause the latch to be incorrectly set.

One method of avoiding this problem is to reduce the amount of stored charge. This will cause the pulse on SIGNAL to get narrower or even disappear. With further reference to FIG. 5, the Schottky diode DSH diverts current away from the drain diode of MPLOAD. Any current that flows in DSH instead of MPLOAD does not cause charge storage.

Figure 10:
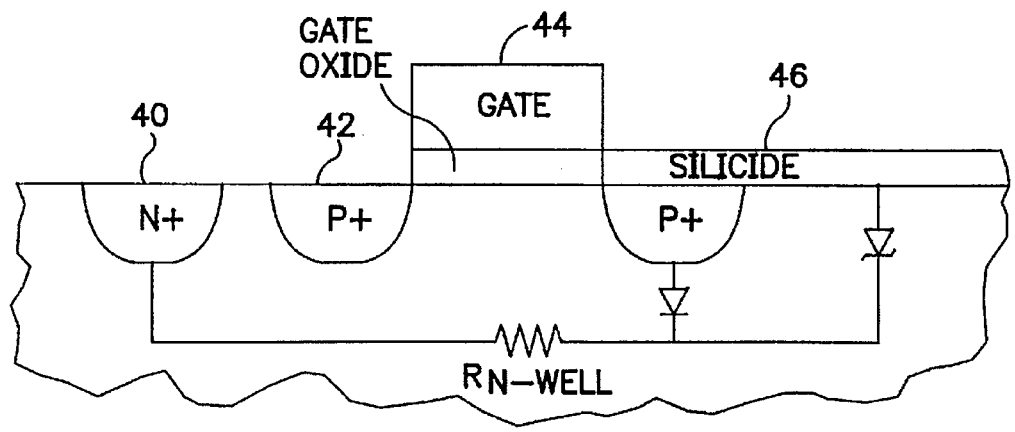
FIG. 10 is a vertical cross-section illustrating an embodiment of the diode for reducing the charge stored in the load transistor.

DSH may be implemented as shown in FIG. 10. The same piece of silicide may be used to contact MPLOAD's drain and to form the anode of DSH. The backgate of MPLOAD and the cathode of DSH may be well 40, the source of MPLOAD may be well 42, the gate of MPLOAD may be gate 44, and the drain of MPLOAD and the anode of DSH may be the silicide 46. Merging DSH with MPLOAD not only saves area but also removes the effect of the n-well resistor, RN-Well. If DSH was implemented as a separate diode the voltage drop across RN-Well would add to the voltage drop across the schottky barrier and DSH would not divert as much current as it does in FIG. 10.

A further method of reducing charge storage may be to reduce a charge in only one of the two transistors, MPLOAD or mpload. By properly selecting the transistor that has less stored charge, the glitch shown on the Signal of the waveforms in FIG. 8 will only reinforce the state of the latch. For example, if the latch is in the "set" state, that is, if Q is high, and the stored charge in MPLOAD is intentionally less than the charge in mpload then the resulting waveforms would be those shown in FIG. 8. In this example, the downward glitch on the SIGNAL line has no effect on the output of the level shifter because the latch is already set.

The transistors MPNP and MNCOL in FIG. 5 divert charge out of the n-well but only if MNCOL is turned-on. The connections to MNCOL are shown in FIG. 3 as the lines to the PNP inputs to half-shifters 22. The PNP input for half-shifter 22a connects to Q of latch 18 and the PNP input of half-shifter 22b connects to Qnot. If Q is high then the transistor MNCOL in half-shifter 22a is on; if Q is low then MNCOL in half-shifter 22b is on. By turning on the appropriate MNCOL, charge is removed from the appropriate MPLOAD via the collector of the parasitic pnp transistor that is the unavoidable by-product of building the PMOS transistor MPNP.

Figure 11:
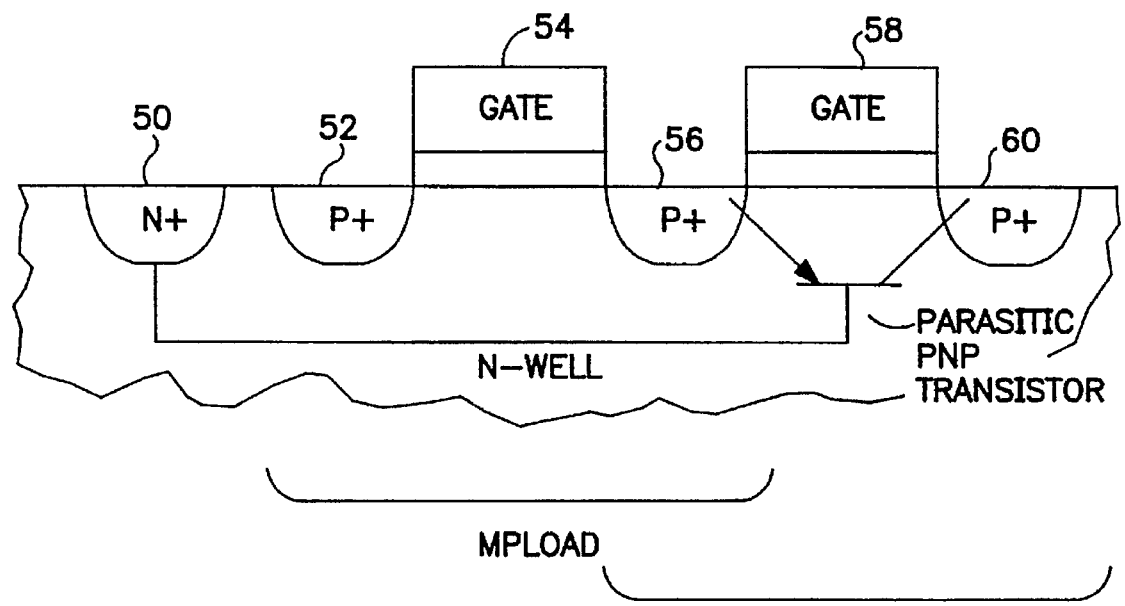
FIG. 11 is a vertical cross-section illustrating an embodiment of the parasitic pnp transistor for reducing the charge stored in the load transistor.

An embodiment of the transistor MPNP is illustrated in FIG. 11. The backgate of MPLOAD and of MPNP and the base of the parasitic pnp transistor may be well 50, the source of MPLOAD may be well 52, the gate of MPLOAD may be gate 54, and the drain of MPLOAD and the drain of MPNP and the emitter of the parasitic pnp transistor may be well 56, the gate of MPNP may be gate 58, and source of MPNP and the collector of parasitic pnp transistor may be well 60. The transistor MPNP is a convenient way to build the parasitic pnp but it could also be formed by adding any p-doped region to the n-well. The schottky diode DSH and the parasitic pnp can both be placed in the same n-well as MPLOAD to further save area.

Correction of Incorrect Latch Setting

Despite all the precautions described above, some event, such as excessive HS variation, a glitch from the VHB supply, or radiation, could cause the latch to change states. The incorrect state may be corrected with additional circuitry that compares the status of latch 18 to the input of the level shifter. If latch 18 output and the level-shifter input do not agree another pulse can be sent through the level shifter to force latch 18 into the correct state. This additional pulse could either be a sequence of pulses or one long pulse. In either case, the pulse may continue until the input and output are in agreement.

Figure 12:
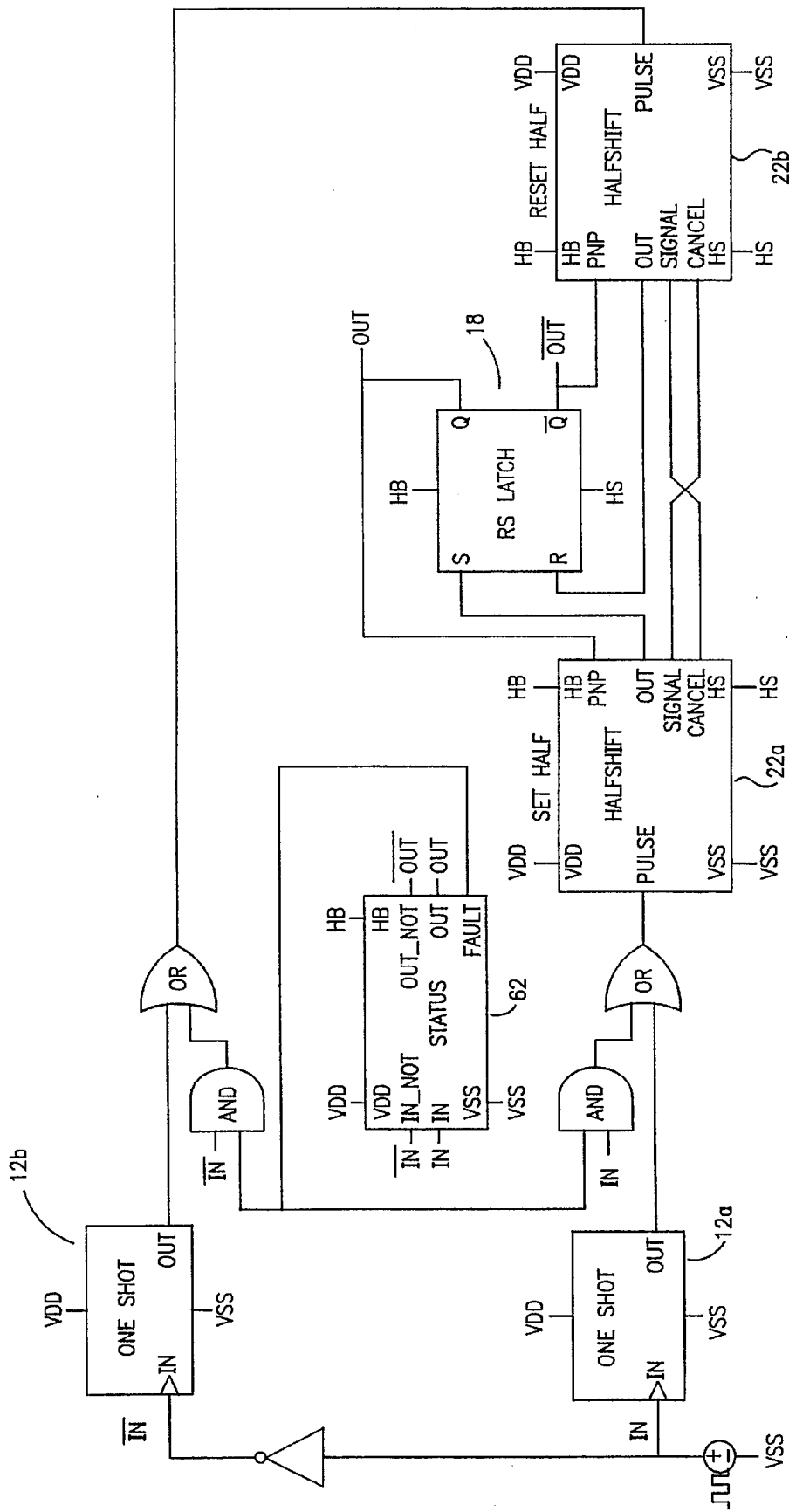
FIG. 12 is a combination block and circuit diagram of a further embodiment of a level shifter of the present invention.

With reference now to FIG. 12, four logic gates and a STATUS circuit 62 may be added to the circuit of FIG. 3. The logic function implemented by STATUS is FAULT=( (IN and not OUT) or (IN NOT and not OUT-NOT)). When the IN node for the level shifter is high latch 18 is supposed to be set, if it is not then FAULT is high. This forces the PULSE input of half-shifter 22a high which, in turn, forces the SET input of latch 18 high and sets latch 18. A similar sequence occurs to reset latch 18 if IN is low and latch 18 is not reset.

Figure 13:
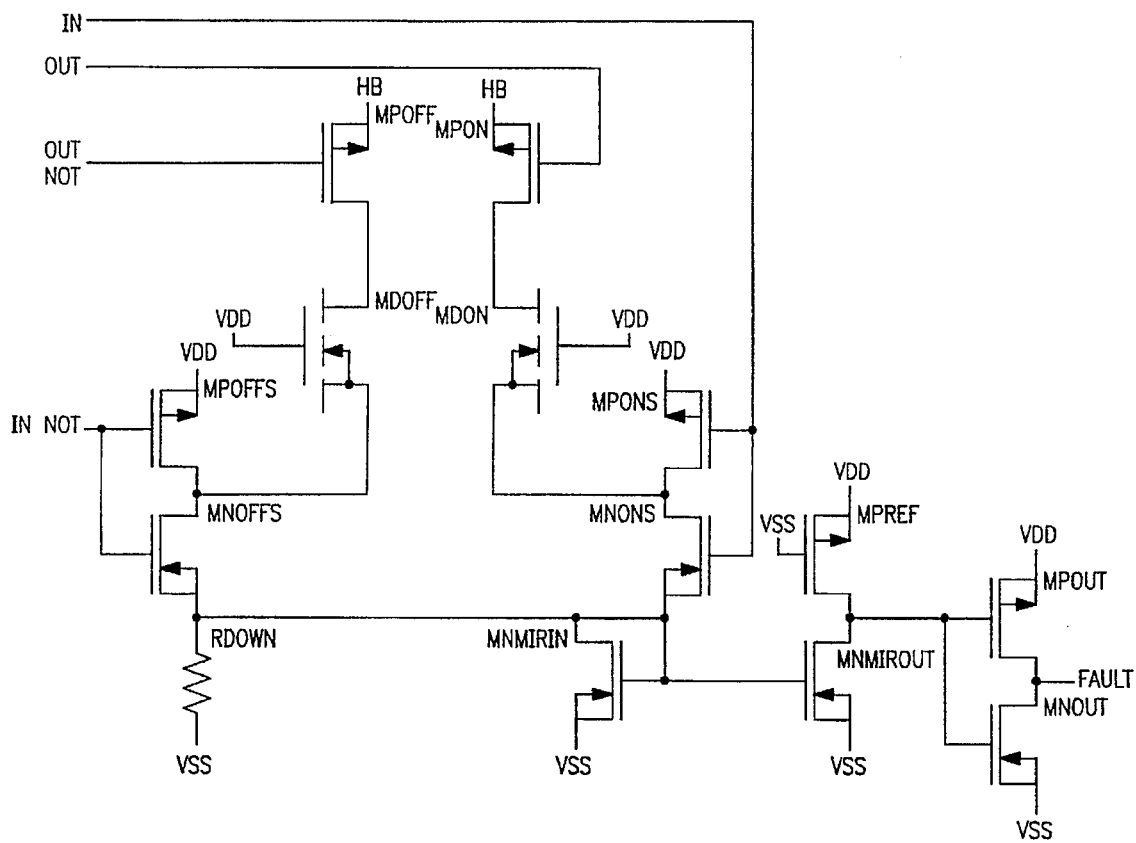
FIG. 13 is a circuit diagram of an embodiment of the status logic circuit of FIG. 12.

As will be appreciated from a review of FIG. 13 that illustrates an embodiment of STATUS circuit 62, the circuit draws no current from HB to VSS during normal operation. The inputs to STATUS circuit 62 during normal operation are either (IN=high, OUT=high, IN NOT=low, OUT NOT=low) or (IN=low, OUT=low, IN NOT=high, OUT NOT=high). These conditions always place turned off transistors between HB and VSS (MPON and MNOFFS in the first condition, MPOFF and MNONS in the second). Only during an abnormal condition does current flow. For example, if IN is high and OUT is low, then current flows from HB through MPON and MDON and MNONS into MNMIRIN. The voltage on the gate of MNMIROUT rises to force the gate of MNOUT low which drives FAULT high. Note that only the transistors that are capable of withstanding high voltages (MPOFF, MDOFF, MPON, and MDON) have high voltage placed on them.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a level shifter for shifting a digital signal from a digital signal input voltage to a digital signal output voltage, the level shifter having (a) first connections for an input supply voltage and for an input reference voltage, (b) second connections for an output supply voltage and for an output reference voltage, (c) a trigger connected to the first connections for triggering a pulse at a transition of the digital signal between the input supply voltage and the input reference voltage, and (d) a latch connected to the second connections for switching the digital signal to one of the output supply voltage and the output reference voltage in response to each pulse from the trigger and holding the digital signal at that voltage, the improvement comprising:

a first half-shifter connected between the trigger and the latch for providing the pulse to the latch when the digital signal transitions from the input supply voltage to the input reference voltage; and a second half-shifter connected between the trigger and the latch for providing the pulse to the latch when the digital signal transitions from the input reference voltage to the input supply voltage, wherein said first and second half-shifters each comprise a selector circuit with plural current mirrors for rejecting voltage variations in said selector circuit that would induce the latch to switch other than in response to the pulse if the voltage variations were provided to the latch.

2. The level shifter of claim 1 wherein each said selector circuit comprises a current source for providing a current to said plural current mirrors responsive to receipt of the pulse, said current source comprising, a first transistor having a control terminal connected to the input supply voltage and a source terminal that is an open circuit when a voltage on the source terminal is less than the input supply voltage, and a second transistor having a control terminal connected to receive the pulse and operating terminals connected between said source terminal of said first transistor and the input reference voltage thereby reducing a capacitance in said selector circuit that induces the voltage variations.

3. The level shifter of claim 2 further comprising a first diode connected between said source of said first transistor and the input supply voltage.

4. The level shifter of claim 2 wherein said plural current mirrors are series connected for preventing an error current induced by a capacitance in said selector circuit from providing voltage variations that would cause the latch to switch, said series connected current mirrors providing two copies of the error current in directions that do not cause the latch to switch, thereby overriding the error current.

5. The level shifter of claim 4 wherein one of said plural current mirrors comprises a load transistor for sensing a voltage related to the pulse, and further comprising a second diode for diverting current from a drain of said load transistor, thereby reducing a charge stored in a junction of said load transistor and reducing a time for discharging the stored charge when the output reference voltage changes from a falling voltage to a rising voltage.

6. The level shifter of claim 5 further comprising a parasitic transistor for selectively diverting current from a drain of said load transistor, thereby selectively reducing a charge stored in a junction of said load transistor in one of said first and second half-shifters so that voltage variations caused by a difference between times for discharging the stored charge in said load transistors in said first and second half-shifters do not cause the latch to switch when the output reference voltage changes from a falling voltage to a rising voltage.

7. The level shifter of claim 1 wherein said plural current mirrors are series connected for preventing an error current induced by a capacitance in said selector circuit from providing voltage variations that would cause the latch to switch, said plural series connected current mirrors providing two copies of the error current in directions that do not cause the latch to switch, thereby overriding the error current.

8. The level shifter of claim 7 wherein said plural series connected current mirrors provide a first one of said copies of the error current before arrival of the error current at the latch and a second of said copies of the error current after arrival of the error current at the latch.

9. The level shifter of claim 7 wherein one of said plural current mirrors comprises a load transistor for sensing a voltage related to the pulse, and further comprising a second diode for diverting current from a drain of said load transistor, thereby reducing a charge stored in a junction of said load transistor and reducing a time for discharging the stored charge when the output reference voltage changes from a falling voltage to a rising voltage.

10. The level shifter of claim 1 wherein one of said plural current mirrors comprises a load transistor for sensing a voltage related to the pulse, and further comprising a second diode for diverting current from a drain of said load transistor, thereby reducing a charge stored in a junction of said load transistor and reducing a time for discharging the stored charge when the output reference voltage changes from a falling voltage to a rising voltage.

11. The level shifter of claim 10 wherein said load transistor and said second diode are in an integrated circuit, and wherein an anode of said second diode is common with a contact for said drain of said load transistor.

12. The level shifter of claim 11 wherein said integrated circuit comprises an N-type well in which the charge is stored, and wherein said anode of said second diode comprises a silicide on said N-type well.

13. The level shifter of claim 10 wherein said plural selector circuit comprises a current source for providing a current to said current mirrors responsive to receipt of the pulse, said current source comprising, a first transistor having a control terminal connected to the input supply voltage and a source terminal that is an open circuit when a voltage on the source terminal is less than the input supply voltage, and a second transistor having a control terminal connected to receive the pulse and operating terminals connected between said source terminal of said first transistor and the input reference voltage thereby reducing a capacitance in said selector circuit that induces the voltage variations.

14. The level shifter of claim 1 wherein one of said plural current mirrors comprises a load transistor for sensing a voltage related to the pulse, and further comprising a parasitic transistor for selectively diverting current from a drain of said load transistor, thereby selectively reducing a charge stored in a junction of said load transistor in one of said first and second half-shifters so that a voltage variation caused by a difference between times for discharging the stored charge in said load transistors in said first and second half-shifters does not cause the latch to switch when the output reference voltage changes from a falling voltage to a rising voltage.

15. The level shifter of claim 14 wherein said parasitic transistor is in an integrated circuit that comprises said load transistor and a selector transistor connected to said drain of said load transistor that has a control terminal for receiving a selection signal from the latch, said selection signal indicating which of said load transistors in said first and second half-shifters is to have the charge stored therein discharged.

16. The level shifter of claim 14 wherein said plural current mirrors are series connected for preventing an error current induced by a capacitance in said selector circuit from providing voltage variations that would cause the latch to switch, said series connected current mirrors providing two copies of the error current in directions that do not cause the latch to switch, thereby overriding the error current.

17. The level shifter of claim 1 further comprising a logic circuit connected between the trigger and said first and second half-shifters for comparing a state of the latch to a state of the digital signal input voltage, and for providing a corrective signal when the two states are different.

18. The level shifter of claim 17 wherein said logic circuit comprises a plurality of transistors that are off when the two states are not different so that no current flows through said logic circuit until the two states are different.

19. A level shifter for shifting a digital signal from a digital signal input voltage to a digital signal output voltage, comprising:

a trigger for triggering a pulse at a transition of the digital signal between an input supply voltage and an input reference voltage;

a latch for switching the digital signal to one of an output supply voltage and an output reference voltage in response to each pulse from the trigger and holding the digital signal at that voltage;

a first half-shifter connected between said trigger and said latch for providing the pulse to said latch when the digital signal transitions from the input supply voltage to the input reference voltage; and a second half-shifter connected between said trigger and said latch for providing the pulse to said latch when the digital signal transitions from the input reference voltage to the input supply voltage, said first and second half-shifters each comprising a selector circuit with plural current mirrors connected to a current source for providing a current to said current mirrors responsive to receipt of the pulse, said current source comprising, a first transistor having a control terminal connected to the input supply voltage and a source terminal that is an open circuit when a voltage on the source terminal is less than the input supply voltage, and a second transistor having a control terminal connected to receive the pulse and operating terminals connected between said source terminal of said first transistor and the input reference voltage thereby reducing a capacitance in said selector circuit that induces the voltage variations.

20. A level shifter for shifting a digital signal from a digital signal input voltage to a digital signal output voltage, comprising:

a trigger for triggering a pulse at a transition of the digital signal between an input supply voltage and an input reference voltage;

a latch for switching the digital signal to one of an output supply voltage and an output reference voltage in response to each pulse from the trigger and holding the digital signal at that voltage;

a first half-shifter connected between said trigger and said latch for providing the pulse to said latch when the digital signal transitions from the input supply voltage to the input reference voltage; and a second half-shifter connected between said trigger and said latch for providing the pulse to said latch when the digital signal transitions from the input reference voltage to the input supply voltage, wherein said first and second half-shifters each comprise a selector circuit with plural series-connected current mirrors for preventing an error current induced by a capacitance in said selector circuit from providing voltage variations that would cause said latch to switch, said series connected current mirrors providing two copies of the error current in directions that do not cause the latch to switch, thereby overriding the error current.

21. A level shifter for shifting a digital signal from a digital signal input voltage to a digital signal output voltage, comprising:

a trigger for triggering a pulse at a transition of the digital signal between an input supply voltage and an input reference voltage;

a latch for switching the digital signal to one of an output supply voltage and an output reference voltage in response to each pulse from the trigger and holding the digital signal at that voltage;

a first half-shifter connected between said trigger and said latch for providing the pulse to said latch when the digital signal transitions from the input supply voltage to the input reference voltage; and a second half-shifter connected between said trigger and said latch for providing the pulse to said latch when the digital signal transitions from the input reference voltage to the input supply voltage, wherein said first and second half-shifters each comprise a selector circuit with plural current mirrors and one of said plural current mirrors comprises a load transistor for sensing a voltage related to the pulse, and further comprising a second diode for diverting current from a drain of said load transistor, thereby reducing a charge stored in a junction of said load transistor and reducing a time for discharging the stored charge when the output reference voltage changes from a falling voltage to a rising voltage.

22. A level shifter for shifting a digital signal from a digital signal input voltage to a digital signal output voltage comprising:

a trigger for triggering a pulse at a transition of the digital signal between an input supply voltage and an input reference voltage;

a latch for switching the digital signal to one of an output supply voltage and an output reference voltage in response to each pulse from the trigger and holding the digital signal at that voltage;

a first half-shifter connected between said trigger and said latch for providing the pulse to said latch when the digital signal transitions from the input supply voltage to the input reference voltage; and a second half-shifter connected between said trigger and said latch for providing the pulse to said latch when the digital signal transitions from the input reference voltage to the input supply voltage, wherein said first and second half-shifters each comprise a selector circuit with plural current mirrors and one of said plural current mirrors comprises a load transistor for sensing a voltage related to the pulse, and further comprising a parasitic transistor for selectively diverting current from a drain of said load transistor, thereby selectively reducing a charge stored in a junction of said load transistor in one of said first and second half-shifters so that a voltage variation caused by a difference between times for discharging the stored charge in said load transistors in said first and second half-shifters does not cause said latch to switch when the output reference voltage changes from a falling voltage to a rising voltage.

23. A level shifter for shifting a digital signal from a digital signal input voltage to a digital signal output voltage, comprising:

a trigger for triggering a pulse at a transition of the digital signal between an input supply voltage and an input reference voltage;

a latch for switching the digital signal to one of an output supply voltage and an output reference voltage in response to each pulse from the trigger and holding the digital signal at that voltage;

a first half-shifter comprising plural current mirrors connected between said trigger and said latch for providing the pulse to said latch when the digital signal transitions from the input supply voltage to the input reference voltage;

a second half-shifter comprising plural current mirrors connected between said trigger and said latch for providing the pulse to said latch when the digital signal transitions from the input reference voltage to the input supply voltage; and a logic circuit connected between said trigger and said first and second half-shifters for comparing a state of said latch to a state of the digital signal input voltage, and for providing a corrective signal when the two states are different, said logic circuit comprising a plurality of transistors that are off when the two states are the same so that current flows through said logic circuit is prevented until the two states are different.

* * * * *